United States Patent [19]

Lin

[11] Patent Number: 5,276,278
[45] Date of Patent: Jan. 4, 1994

[54] HOUSING OF CEILING FAN CONTROL CIRCUIT BOARD

[76] Inventor: Min-Huei Lin, No. 138, Sec. 3, Tien-Tsing Road, Taichung, Taiwan

[21] Appl. No.: 28,265

[22] Filed: Mar. 9, 1993

[51] Int. Cl.$^5$ .............................................. H05K 5/02
[52] U.S. Cl. .................................. 174/52.1; 361/692; 361/752
[58] Field of Search ............... 174/52.1; 361/392, 394, 361/395, 397, 399

[56] References Cited

U.S. PATENT DOCUMENTS

| | | | |
|---|---|---|---|
| 4,226,491 | 10/1980 | Kazama | 339/17 LM |
| 4,599,484 | 7/1986 | Bramwell | 174/52 R |
| 4,672,510 | 6/1987 | Castner | 361/415 |
| 4,717,216 | 1/1988 | Hornak | 312/257 R |

*Primary Examiner*—Leo P. Picard
*Assistant Examiner*—Geoffrey Cumbus
*Attorney, Agent, or Firm*—Browdy and Neimark

[57] ABSTRACT

A housing of ceiling fan control circuit board is composed of a body and a cover plate. The body is provided respectively at both ends of a longitudinal axis thereof with a recessed arcuate portion extending upwards and obliquely from a bottom plate of the body, and with a protruded arcuate portion extending uprightly from the recessed arcuate portion. The body is further provided respectively at both ends of a short axis thereof with an anterior plate and a posterior plate, which form, in conjunction with the recessed arcuate portion and the protruded arcuate portion, a shape so similar to a boat hull as to fit securely into a receiving space of a suspension cup of a ceiling fan. The body contains a space formed by a plurality of stopping wings, the anterior plate and the posterior plate for mounting therein the circuit board and electronic elements.

3 Claims, 3 Drawing Sheets

HOUSING OF CEILING FAN CONTROL CIRCUIT BOARD

FIELD OF THE INVENTION

The present invention relates to a constituent part of a ceiling fan, and more particularly to a box housing a control circuit board of the ceiling fan.

BACKGROUND OF THE INVENTION

According to the prior art of making a ceiling fan, the interconnected circuits and other components of the ceiling fan control circuit are mounted on a circuit board, which is then insulated with the insulating paper before it is housed in a suspension cup of the ceiling fan. The suspension cup is generally provided with a suspension frame, which often limits the size of the space available for accommodating the circuit board. If the circuit board is wrapped very loosely with the insulating paper, the wrapped circuit board can be hardly forced into the suspension cup. On the other hand, if the circuit board is wrapped exceedingly tight with the insulating paper, the insulating paper wrapping the circuit board is often vulnerable to being torn up by the electronic elements of the circuit board in the course of lodging the wrapped circuit board. As a result, the circuit board can not be held securely in the suspension cup of the ceiling fan, thereby bringing about a poor circuit contact.

SUMMARY OF THE INVENTION

It is therefore the primary objective of the present invention to provide a housing of a ceiling fan control circuit board, which can be put into a suspension cup of a ceiling fan conveniently, securely, and rapidly.

It is another objective of the present invention to provide a housing of a ceiling fan control circuit board, which is capable of averting a poor circuit contact.

In keeping with the principles of the present invention, the foregoing objectives of the present invention are attained by a housing of ceiling fan control circuit board, which comprises mainly a body and a cover plate. The body has a bottom plate provided with a left plate and a right plate, which are located uprightly and respectively at the ends of the longitudinal axis of the bottom plate. The bottom plate is further provided with an anterior plate and a posterior plate, which are located uprightly and respectively at the ends of the short axis of the bottom plate. The left plate, the right plate, the anterior plate, and the posterior plate are corresponding in height and form an open end opposite to the bottom plate. The cover plate is arranged on the open end of the bottom plate. The housing of ceiling fan control circuit board is characterized in that each of the anterior plate and the posterior plate has a short side making contact with the bottom plate and has an open side longer in length than the short side, and that either anterior plate or posterior plate is provided with a through hole. The housing of ceiling fan control circuit board is further characterized in that its bottom plate has two protruded arcuate sides located respectively at the ends of the longitudinal axis of the bottom plate, and that each of the left plate and the right plate has a recessed arcuate portion extending upwards and outwards from the protruded arcuate side of the bottom plate, with the recessed arcuate portion having an end which extends uprightly to form a protruded arcuate portion corresponding in curvature to the protruded arcuate side of the bottom plate, and with the recessed arcuate portion having an inner side provided with a plurality of stopping wings which are spaced apart and which extend uprightly in such a manner that they make contact with the protruded arcuate portion. Each of the stopping wings has a flat open side. The cover plate is fastened to the open end of the left plate and the right plate by means of a plurality of tenons and mortises. The ceiling fan control circuit board is received in a space formed by the anterior plate, the posterior plate, and the stopping wings. The electric guide wires of the circuit board are permitted to pass through a wire hole of the housing which is fastened securely to the suspension cup by means of the recessed arcuate portions of the left plate and the right plate.

DETAILED DESCRIPTION OF THE PREFERRED EMBODIMENT

Figure 1:
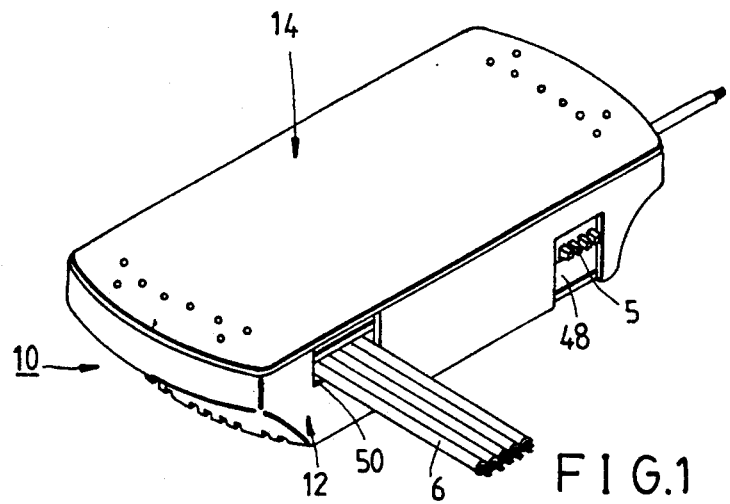
FIG. 1 shows a perspective view of a preferred embodiment housing a circuit board, according to the present invention.

Referring to all drawings provided herewith, a housing 10 of a ceiling fan control circuit board is shown to comprise a body 12 and a cover plate 14.

The body 12 of substantially rectangular construction has a bottom plate 16, which is provided with two protruded arcuate sides 18 and 20 located respectively at the ends of the longitudinal axis of the bottom plate 16, and with a left plate 22 and a right plate 24 which extend upwards and respectively from the protruded arcuate sides 20 and 18, and further with an anterior plate 26 and a posterior plate 28 which extend upwards and are located respectively at the ends of the short axis of the bottom plate 16. The left plate 22, the right plate 24, the anterior plate 26, and the posterior plate 28 are equal in height and form an open end opposite to the bottom plate 30. The cover plate 14 is placed on the open end 30.

Figure 3:
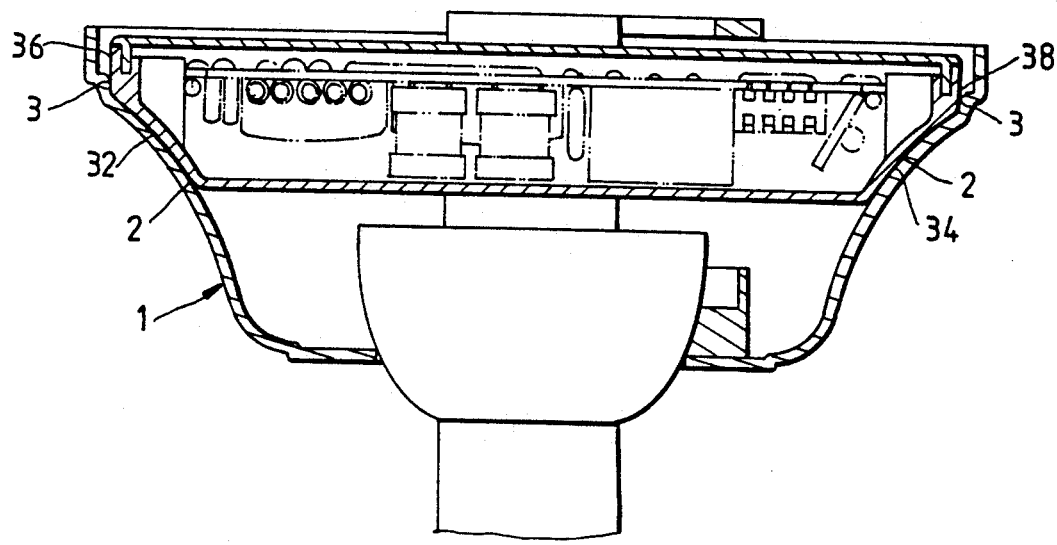
FIG. 3 shows a sectional view taken aloha the direction of the longitudinal axis of the housing which is embodied in the present invention and which is lodged in a suspension cup of a ceiling fan.
Figure 4:
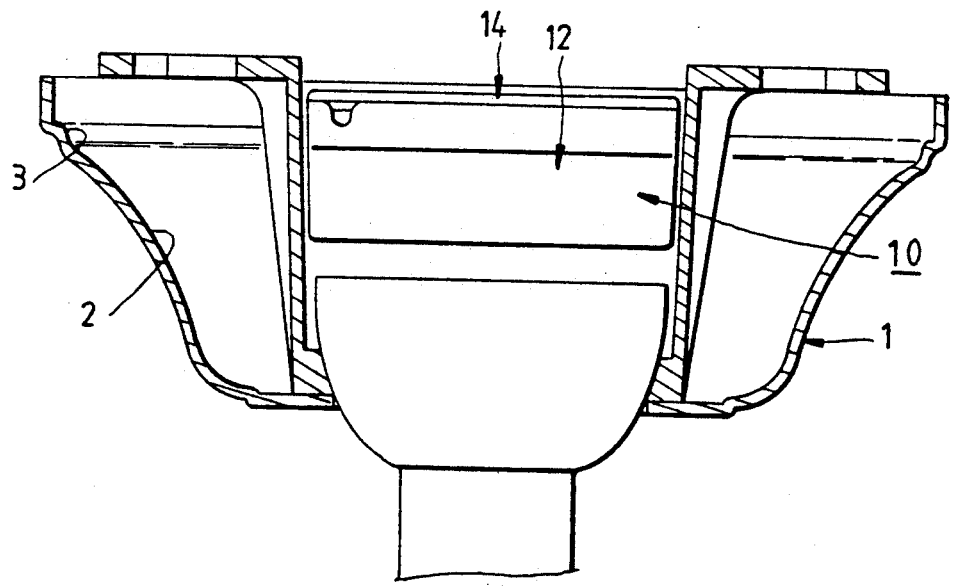
FIG. 4 shows a sectional view taken along the direction of the short axis of the housing which is embodied in the present invention and which is lodged in the suspension cup of the ceiling fan.
Figure 5:
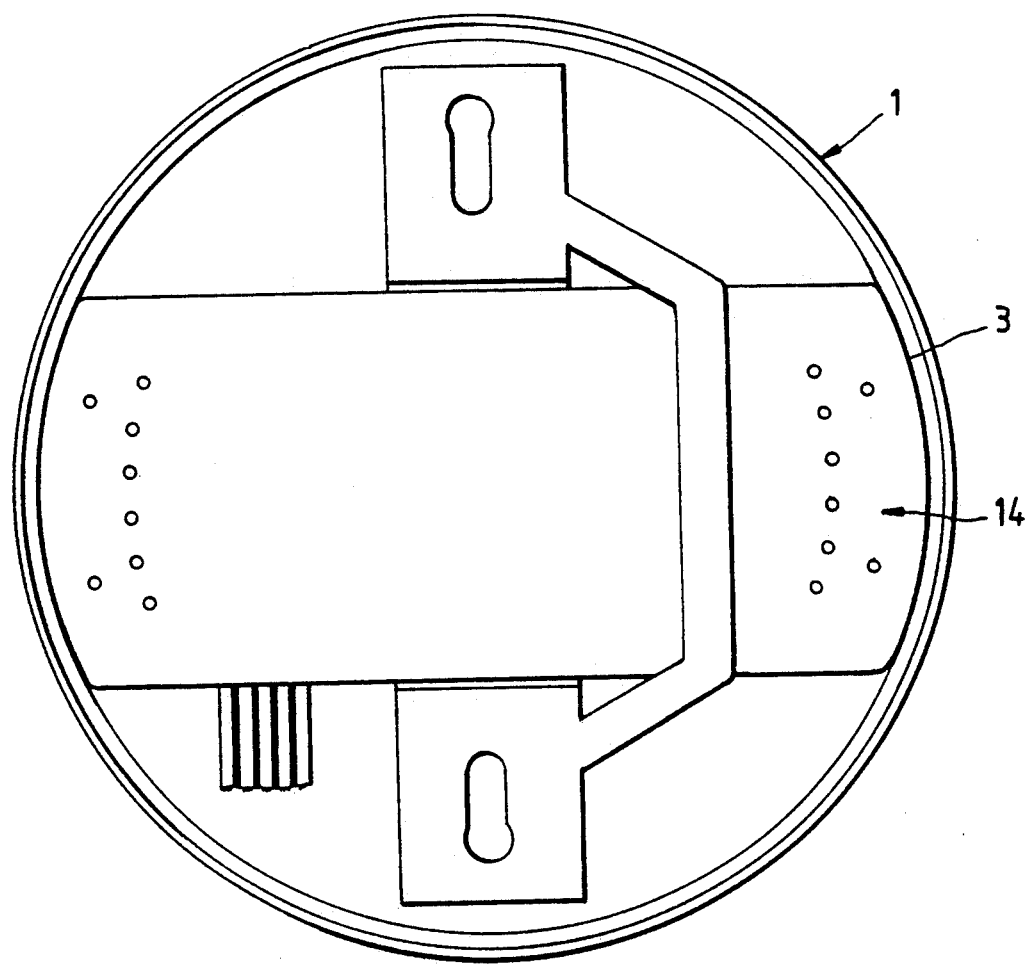
FIG. 5 shows a top view of the housing which is embodied in the present invention and which is lodged in the suspension cup of the ceiling fan.

Each of the anterior plate 26 and the posterior plate 28 has an open side and a bottom side which is fastened to the bottom plate 16 and is shorter than the open side. The left plate 22 is provided with a recessed arcuate portion 32 extending upwards and obliquely from the protruded arcuate side 20 of the bottom plate 16 while the right plate 24 is provided with a recessed arcuate portion 34 extending upwards and obliquely from the protruded arcuate side 18. Each of the recessed arcuate portions 32 and 24 has a curvature that is corresponding to a camber 2 located at a predetermined position inside a suspension cup 1 of a ceiling fan, as shown in FIGS. 3 and 4. In addition, the left plate 22 is provided with a protruded arcuate portion 36 extending uprightly while the right plate 24 is provided with a protruded arcuate portion 38 extending uprightly. As a result, the body 12 has an outer face so shaped as to fit into a residual space inside the suspension cup 1 in such a manner that the recessed arcuate portions 32 and 34 are fastened securely to the camber 2 of the suspension cup 1, and that the protruded arcuate portions 36 and 38 are fastened securely to inner annular surfaces 3 of the suspension cup 1.

The left plate 22 and the right plate 24 are provided respectively with three stopping wings 40 and 42, which are spaced equidistantly and extend uprightly and respectively from the recessed arcuate portions 32 and 34. The stopping wings 40 and 42 are provided respectively with flat and straight open sides 44 and 46, which form a receiving space in conjunction with the anterior plate 26 and the posterior plate 28 for accommodating a circuit board 4 of rectangular construction in such a manner that an inner side containing various electronic elements of the circuit board 4 faces the bottom plate 16, and that both sides of the circuit board 4 located at the ends of the short axis of the circuit board 4 are fastened respectively with the open sides 44 and 46 of the stopping wings 40 and 42, and further that both sides of the circuit board 4 located at the ends of the longitudinal axis of the circuit board 4 are attached respectively to the anterior plate 26 and the posterior plate 28.

Figure 2:
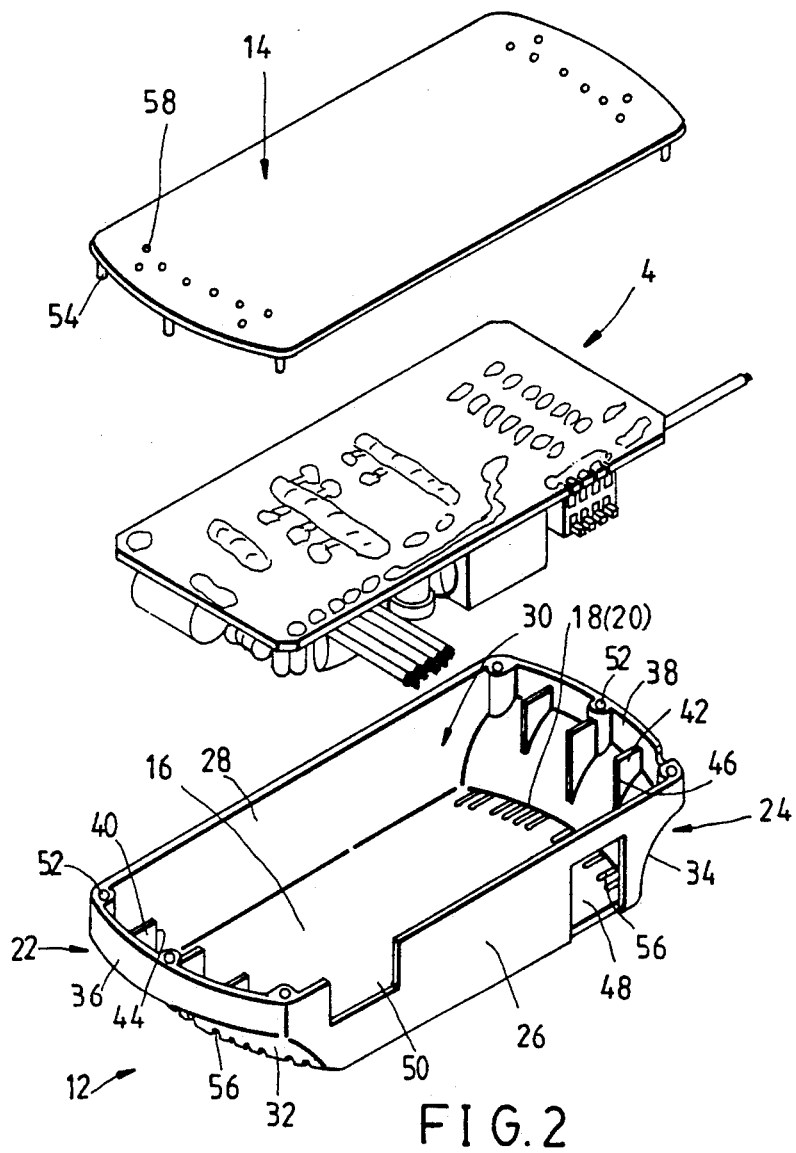
FIG. 2 shows an exploded view of the preferred embodiment as shown in FIG. 1.

As shown in FIGS. 1 and 2, the anterior plate 26 is provided with a through hole 48 for making a switch 5 of the circuit board accessible, and with a wire hole 50 for allowing a plurality of electric guide wires 6 of the circuit board 4 to pass through.

The body 12 and the cover plate 14 are joined together by means of three equidistantly spaced mortises 52 provided respectively on the left plate 22 and the right plate 24, and of three tenons 54, which are provided respectively at the both ends of the underside of the cover plate 14 and which are corresponding in location to the mortises 52 of the body 12. Located at the junctions between the bottom plate 16 and the left plate 22, and between the bottom plate 16 and the right plate 24 are a plurality of strip ventilation holes 56. In addition, the cover plate 14 is provided at both ends of the longitudinal axis thereof with a plurality of circular ventilation holes 58.

The circuit board housing 10 of the present invention is so ingeniously designed that the body 12 of the housing 10 has an outer surface which is similar in shape to a boat hull and can be fitted securely and rapidly into the residual space of the suspension cup 1 of the ceiling fan. As a result, a poor circuit contact is averted. Moreover, the circuit board 4 of the present invention is lodged in the receiving space formed by the stopping wings 40 and 42 and the anterior plate 26 and the posterior plate 28, thereby making the electronic elements of the circuit board 4 less vulnerable to damage or poor contact caused by an insecure location of the receiving space in which the circuit board is placed. The circuit board housing 10 of the present invention has therefore overcome the shortcomings of the circuit board housing of the prior art.

What is claimed is:

1. A housing of ceiling fan control circuit board comprising:

a body having a bottom plate, which is in turn provided with a left plate and a right plate which extend uprightly and respectively from both ends of a longitudinal axis of said bottom plate, and with an anterior plate and a posterior plate which extend uprightly and respectively from both ends of a short axis of said bottom plate, said left plate, said right plate, said anterior plate and said posterior plate being equal in height and forming an open end opposite to said bottom plate; and a cover plate disposed on said open end;

wherein each of said anterior plate and said posterior plate has a fastening side and an open side, with said fastening side being fastened to said bottom plate and being shorter than said open side, and either said anterior plate or said posterior plate being provided with at least a through hole; wherein said bottom plate has a protruded arcuate side located respectively at both ends of said longitudinal axis of said bottom plate, said left plate and said right plate having respectively a recessed arcuate portion extending upwardly and obliquely from said protruded arcuate side of said bottom plate, said left plate and said right plate further having respectively a protruded arcuate portion extending uprightly from an end of said recessed arcuate portion such that said protruded arcuate portion has a curvature corresponding to a curvature of said protruded arcuate side, said left plate and said right plate still further having respectively a plurality of stopping wings which are spaced at a predetermined interval and which extend uprightly from an inner side of said recessed arcuate portion in such a manner that a side of each of said stopping wings is attached to an inner side of said protruded arcuate portion, and that each of said stopping wings has an open side that is flat and straight; wherein said cover plate is fastened to said open end of said body by means of a plurality of tenons of said cover plate and of mortises of said left plate and said right plate; wherein said body contains a receiving space formed by said stopping wings, said anterior plate and said posterior plate for mounting therein a ceiling fan control circuit board in such a manner that a plurality of guide wires of said ceiling fan control circuit board are allowed to pass through said through hole of either said anterior plate or said posterior plate; and wherein said recessed arcuate portion of each of said left plate and said right plate is so shaped as to fit securely into a camber of a suspension cup of a ceiling fan at such time when said body is joined with said cover plate.

2. The housing of ceiling fan control circuit board according to claim 1 wherein said cover plate is provided with a plurality of ventilation holes.

3. The housing of ceiling fan control circuit board according to claim 1 wherein said body is provided with a plurality of ventilation holes located at a junction between said bottom plate and said left plate, and at a junction between said bottom plate and said right plate.

* * * * *